United States Patent
Schuster et al.

(10) Patent No.: US 7,523,538 B2
(45) Date of Patent: Apr. 28, 2009

(54) METHOD FOR MOUNTING A GRADIENT COIL IN A CYLINDRICAL MAGNET OF A MAGNETIC RESONANCE SYSTEM

(75) Inventors: Johann Schuster, Oberasbach (DE); Stefan Stocker, Großenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 422 days.

(21) Appl. No.: 11/358,837

(22) Filed: Feb. 21, 2006

(65) Prior Publication Data

US 2006/0186873 A1    Aug. 24, 2006

(30) Foreign Application Priority Data

Feb. 21, 2005    (DE) .................. 10 2005 007 892

(51) Int. Cl.
*H04R 31/00* (2006.01)

(52) U.S. Cl. .................. 29/594; 29/592.1; 29/602.1; 29/605; 29/606; 29/609.1; 310/179; 310/208; 336/212; 336/213; 347/68; 347/71

(58) Field of Classification Search ................ 29/592.1, 29/602.1, 594, 605, 606, 609.1; 310/179, 310/208; 336/212, 213; 347/68, 71; 324/119, 324/120

See application file for complete search history.

(56) References Cited

U.S. PATENT DOCUMENTS

| 6,842,005 | B2 * | 1/2005 | Schuster | 324/318 |
| 6,952,099 | B2 * | 10/2005 | Renz et al. | 324/318 |
| 2004/0061499 | A1 * | 4/2004 | Stocker | 324/318 |

FOREIGN PATENT DOCUMENTS

DE    102 48 499 A1    5/2004

\* cited by examiner

*Primary Examiner*—Paul D Kim

(57) ABSTRACT

Method for mounting a gradient coil in a cylindrical magnet of a magnetic resonance system and associated magnetic resonance system, wherein the exterior of the gradient coil is foam-bonded flat against the inner wall of the magnet at least in sections, at least one element being foamed in place during mounting, thus creating at least one continuous channel, said channel being used for the insertion of a cutting and/or separating tool for ripping open the foam bond between the gradient coil and the cylindrical magnet.

15 Claims, 2 Drawing Sheets

METHOD FOR MOUNTING A GRADIENT COIL IN A CYLINDRICAL MAGNET OF A MAGNETIC RESONANCE SYSTEM

CROSS REFERENCE TO RELATED APPLICATION

This application claims priority of the German application No. 10 2005 007 892.3 DE filed Feb. 21, 2005, which is incorporated by reference herein in its entirety.

FIELD OF THE INVENTION

The invention relates to a method for mounting a gradient coil in a cylindrical magnet of a magnetic resonance system and associated magnetic resonance system, wherein the exterior of the gradient coil is foam-bonded flat against the inner wall of the magnet at least in sections.

BACKGROUND OF THE INVENTION

When mounting gradient coils in cylindrical magnets of magnetic resonance systems, it may sometimes be beneficial to bond the exterior of the gradient coil as flat as possible, at least in sections, to the inner wall of the magnet, in order thus to suppress vibrations and noise. As noise in the form of airborne sound can escape from the resulting gap between the gradient coil and the magnet cylinder, it is advantageous to seal this gap either partially or even completely. To this end, isolated attempts have been made to cast the gradient coil in place by means of an epoxy casting compound or to foam it in place using construction foam.

However, the problem with using an epoxy casting compound or construction foam is that it is then virtually impossible to replace the gradient coil in the event of a fault or, for example, after ingress of water into the equipment.

However, if the gradient coil is only wedged into the magnet bore or supported on special bearing blocks not connected to the magnet, on the one hand too much space is required, while on the other hand the sealing of the gap between the gradient coil and the cylindrical magnet, or more specifically the bonding of the exterior of the gradient coil flat to the inner wall of the magnet, is not achieved, with the result that vibrations and noise are not suppressed.

DE 102 48 499 A1 discloses a magnetic resonance tomography equipment with a nondestructively releasable adhesive bond between equipment components. There the gradient coil is likewise fixed in the cylindrical magnet by an all-round foam layer. If the gradient coil is removed, after the foam layer has been e.g. sawn open, with the equipment described in the cited document any remaining foam or filling compound residues can be easily removed due to the fact that a separating layer is provided which is disposed on their boundary layer to a foamed-in equipment component. This separating layer constitutes to some extent a nominal fracture point which allows easy detachment of the filling compound residues after the part to be separated has been released or dismantled, thereby obviating the need for time-consuming cleaning of the surface.

SUMMARY OF THE INVENTION

The object of the invention is therefore to specify an in this respect improved method for mounting a gradient coil in a cylindrical magnet of a magnetic resonance system.

This object is achieved for a method of the above mentioned kind in that it is inventively provided for at least one element, which creates at least one continuous channel in the direction of the coil's longitudinal axis, to be foamed in place during mounting, said channel being used for inserting a cutting and/or separating tool for ripping open the foamed-in bond between the gradient coil and the cylindrical magnet.

The mounting method according to the invention therefore advantageously provides for foaming an element in place which creates an opening or channel which penetrates the foam layer in the longitudinal direction of the coil, thereby enabling the gradient coil to be easily removed. The bond attaching the exterior of the gradient coil to the inner wall of the magnet can be easily ripped open by first inserting a suitable cutting and/or separating tool into the channel-shaped opening or the plurality of channel-shaped openings in the foam in order to cut or rip the foam open from inside these channels and thus remove the gradient coil if it is defective, for example.

When the foam layer has been ripped open, the coil can be removed and the foam residues cleaned from the magnet bore, for which purpose a metal scraper, for example, can be used. By providing access for a cutting and/or separating tool, replacement of the gradient coil is possible even when it has been foamed in place, a technique which offers clear advantages in respect of vibration and noise generation.

According to the invention, a hose or tube can be foamed in place as a channel creating element. The hose or tube is foamed into the annular gap in the axial direction, thereby producing an access channel enabling the foam to be ripped open all round. By selecting an appropriate material for the hose or tube, it can be removed when the foam has cured. For this purpose a material must be selected which does not adhere to the foam or which has been externally treated with a separating agent.

The foamed-in element can have a conical profile. A conical implementation of this kind facilitates the insertion of separating or cutting tools.

In addition, a Teflon element and/or a metal element, in particular a metal element treated with a separating agent, can be used. If the element, of which there is at least one, is made of Teflon or is at least Teflon coated on its exterior, it will not adhere to the foam and can be removed again when the foam has cured, a channel or access opening being created. A removable element of this kind can be hollow or solid. Moreover, a metal element treated with a separating agent can conceivably be used, which element is likewise removed again after the foam has hardened.

By means of the foaming-in process, it is provided according to the invention for a bond to be established between the exterior of the gradient coil and the inner wall of the magnet over a gap of 1 mm to 10 mm, specifically 5 mm, thereby bridging the frequently approx. 5 mm wide annular gap and producing a seal which prevents noise escaping from the gap.

An embodiment of the invention provides for two foam layers to be applied circumferentially to the exterior of the gradient coil. These foam layers are separate from one another in the longitudinal direction and are selected such that on the one hand there is an optimum bond between the gradient coil and magnet, while on the other hand foaming-in can take place easily and quickly.

The foam layers are advantageously implemented in the area of the opposite ends relative to the longitudinal axis of the coil. The foam layers implemented in the respective end regions of the coil eliminate any open gaps having a depth such that noise could arise. The distance between the foam layers and the ends of the gradient coil can range from a few millimeters to a few centimeters.

The foam layers can be implemented 100 to 200 mm deep in the direction of the longitudinal axis of the gradient coil. This depth is advisable for typical gradient coil lengths of 600 to 1300 mm or a coil outer diameter ranging from 800 to 900 mm. Other depths can also be selected depending on the size of the gradient coil or magnet and depending on the vibration and noise suppression requirements.

It is provided according to the invention for 1 to 10, in particular 4, channels to be created in the foam, it being possible for each channel to be created by a different foamed-in element. However, it is likewise possible to select an element which is bent round outside the foam layer, such as a flexible tube, in order to produce a plurality of channels simultaneously with one element. The number of channels depends on how convenient removal of coil can be ensured without impairing secureness or noise suppression. If it seems highly unlikely that the gradient coil will need to be removed, one channel may suffice. Using 4 channels with similar spacings over the circumference of the coil allows convenient removal of same.

It can be also be ensured according to the invention that the gradient coil is securely supported by inserting wedges on the underside. This provides static relief in respect of the force due to weight emanating from the coil. In addition, the wedges, which can be e.g. hammered in or inserted in some other manner in the gap, can be helpful for mounting the coil by allowing initial positioning prior to foaming in place. The tapered shape of the wedges allows easy insertion and equally easy removal, e.g. when the gradient coil is to be dismounted. The wedges can also be subsequently inserted in a preferably not yet cured foam layer.

The wedges can be designed for positive embedding in the foam, in particular by means of grooves preferably located on the side of the wedges facing the magnet. Any slippage of the wedges can be prevented by the positive embedding in the foam.

According to the invention, a pressure-resistant and fine-pored foam, in particular requiring no moisture for curing, is used for foaming-in. This can be a two-component expansion foam, for example.

The channel can be implemented to allow for the introduction of a heated wire and/or saw, in particular a keyhole saw or saber saw, and/or a sawing wire as a cutting and/or separating tool. Depending on the type of cutting or separating tool, elements must be used which produce channels with suitable diameters or shapes. For example, for inserting a heated wire a single small-diameter channel is required, the diameter of which can moreover be the same over the entire length of the foam layer. For using a sawing wire, on the other hand, a channel with a large diameter will generally be desirable. For particular saws, a tapering implementation of the access opening may be suitable.

The invention additionally relates to a magnetic resonance system comprising at least one gradient coil which is mounted, particularly by the implementation of a method as described above, in a cylindrical magnet in such a way that the exterior of the gradient coil is foam-bonded flat against the inner wall of the magnet at least in sections, the foam having at least one channel which runs continuously in the direction of the longitudinal axis of the coil and which is suitable for the insertion of a cutting and/or separating tool for ripping open the foam bond between the gradient coil and the cylindrical magnet and therefore for removing the gradient coil.

By means of the above-described gradient coil mounted in the cylindrical magnet it is possible in the case of a magnetic resonance system according to the invention for the gradient coil to be easily removed in the event of a fault by inserting a cutting or separating tool into the access channel(s) in order to rip open the foam all round from inside the access channels produced e.g. by a foamed-in tube. At the same time, with the magnetic resonance system according to the invention, the exterior of the gradient coil is bonded flat against the internal wall of the magnet at least in sections in order to suppress vibrations and noise. Despite it being possible to remove the gradient coil again if necessary, the space requirement is much lower compared to fixing arrangements based exclusively on wedging the coil in place in the magnet bore or supporting same on special bearing blocks.

BRIEF DESCRIPTION OF THE DRAWINGS

Further advantages, features and details will emerge from the following exemplary embodiments in conjunction with the accompanying drawings, in which.

DETAILED DESCRIPTION OF THE INVENTION

Figure 1:
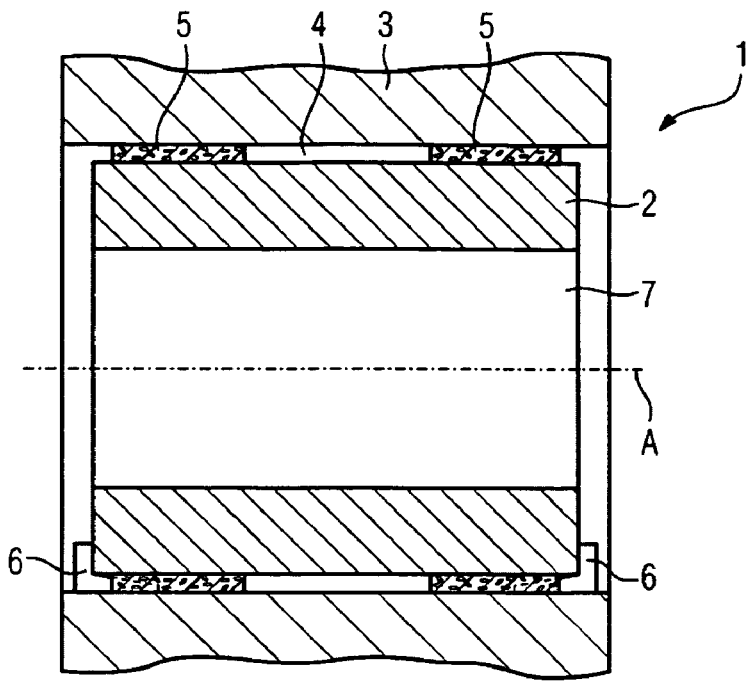
FIG. 1 shows a longitudinal section through a magnetic resonance system having a gradient coil mounted according to a method according to the invention.

FIG. 1 shows a longitudinal section through a magnetic resonance system 1 having a gradient coil mounted according to a method according to the invention. The gradient coil 2 is approximately 800 mm long. It is mounted in a cylindrical magnet 3 from which it is separated by an annular gap 4 of approximately 5 mm. The gradient coil 2 is enclosed by two foam layers 5 which are implemented at opposite ends relative to the longitudinal axis of the coil 2. The foam layers 5 are approximately 200 mm deep. The depth must be optimized in respect of the geometry of the particular magnetic resonance system 1.

On the underside of the arrangement there are additionally inserted two wedges 6 which have raised end sections which seal with the ends of the gradient coil 2. These wedges 6 are hammered into the foam layer 5 and are used to provide static relief in respect of the dead weight of the gradient coil 2. When inserted in advance, the wedges 6 are helpful for coil mounting, as they allow the coil to be securely positioned even before the foam has cured. The wedges 6 are positively embedded in the foam layer 5. The foam layer 5 additionally has four channels (not shown here) which run through the foam layers 5 in the direction of the longitudinal axis of the resonance equipment. Using these channels it is possible, as will be explained below, to remove the gradient coil 2 again from the magnetic resonance system 1 or more specifically the magnetic resonance tomograph shown here. The diagram additionally shows the longitudinal axis A of the gradient coil or rather of the system 1.

Figure 2:
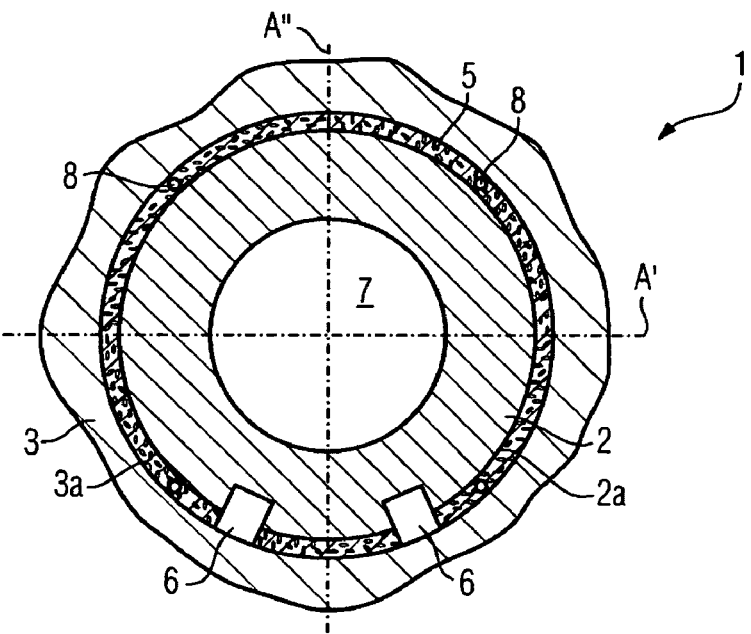
FIG. 2 shows a view of a magnetic resonance system according to FIG. 1.

FIG. 2 shows a head-on view of the magnetic resonance system 1 according to FIG. 1. The gradient coil 2, which has an outer diameter of 800 mm, surrounds an opening 7 into which a patient on a positioning table is moved for examination. The system 1 has an outer magnet 3 which is separated from the gradient coil 2 by a foam layer 5. On the underside, the gradient coil 2 is supported by two wedges 6 which engage in the foam layer 5. To make the construction clear, the transverse axes A' and A" of the system 1, which represent the horizontal and vertical direction respectively, are shown.

In the longitudinal direction of the system 1 or more precisely in the direction of the longitudinal axis of the gradient coil 2, the foam layer 5 is interspersed with channels 8 which penetrate the foam layer 5 over its entire depth. The channels 8 taper from the ends of the gradient coil 2 towards the center, although channels with a constant circumference are likewise conceivable depending on which tool is to be used for detaching the gradient coil 2. If the coil is now to be replaced due to a problem, i.e. the coil is defective or water has penetrated the arrangement, a cutting or separating tool is inserted into one of the four channels 8 in order to rip out the foam layer 5 from inside said channel, a total of four channels 8 spaced approximately equally apart around the circumference of the gradient coil 2 being advisable in order to allow convenient detachment of the coil 2.

Once the foam layer 5 has been ripped open for removal of the gradient coil 2, the interior 3a of the cylindrical magnet 3, which was hitherto bonded to the exterior 2a of the gradient coil 2 via the foam layer 5, can be quickly cleaned of foam residues without major effort e.g. using a metal scraper.

The channels 8 were created by hose-shaped elements (not shown) which in this case were removed again after the foam had cured, leaving behind the channels 8. It is alternatively conceivable for such elements to be foamed-in, in which case they must be manufactured in such a way that they can be easily cut open in order not to impede the removal of the gradient coil 2.

By means of the method according to the invention, after the gradient coil 2 has been mounted in the magnetic resonance system 1 shown, the exterior 2a of the gradient coil is bonded, at least in part, flat against the inner wall or interior 3a of the magnet 3, thereby effectively suppressing vibrations and noise. At the same time, despite the gradient coil 2 being foamed in place, it is easily possible to remove it again by ripping open the foam layer 5, suitable tools being inserted in the channels 8 from inside which the coil 2 can be detached.

Figure 3:
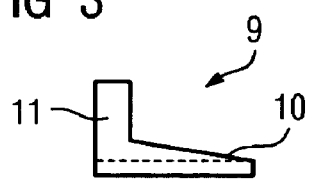
FIG. 3 shows a side view of a wedge used to secure the gradient coil in a method according to the invention.

FIG. 3 shows a side view of a wedge 9 used for securing the gradient coil in a method according to the invention. The wedge 9 has a raised section 11 and a sloping section 10. When the wedge 9 has been inserted in the foam layer, the raised section 11 is positioned such that it bears against the transverse face of the gradient coil. The wedge 9 therefore protrudes by the width of its raised section 11 from the arrangement comprising gradient coil and annular gap with foam layer. The sloping section 10 of the wedge 9 facilitates the insertion of the wedge 9 into the foam layer and enables the wedge 9 to be retained in same.

Figure 4:
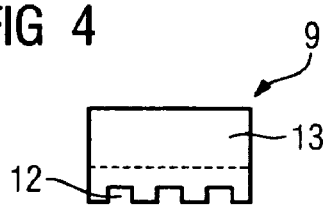
FIG. 4 shows a front view of a wedge according to FIG. 3.

FIG. 4 is a head-on view of the wedge 9 from FIG. 3 showing grooves 12 on the underside of the front face 13. Said grooves 12 ensure positive embedding of the wedge 9 in the foam, thereby preventing the wedge 9 from slipping.

Figure 5:
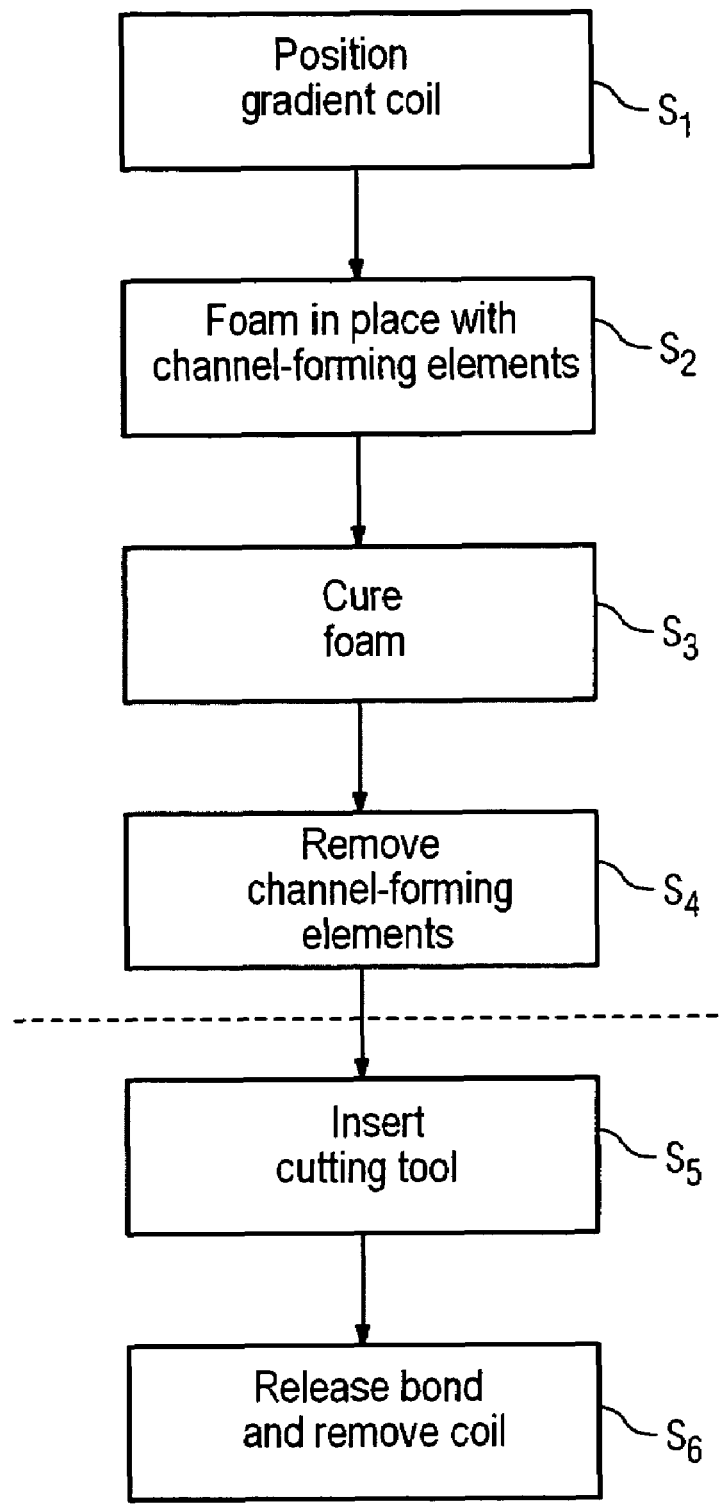
FIG. 5 shows a flowchart of a method according to the invention for mounting a gradient coil and removing same.

FIG. 5 shows a flowchart of a method according to the invention for mounting and removing a gradient coil. First, in step S1, the gradient coil is positioned inside a surrounding cylindrical magnet, said positioning being facilitated by the use of wedges on which the coil is supported on its underside. In step S2 the coil is foamed in place in the bore of the magnet, an element e.g. made of Teflon or a metal profile treated with a separating agent being foamed into the annular gap surrounding the annular coil. The foaming-in is performed in such a way that two foam layers with a particular depth are created at least in the region of the end of the coil in each case. In step S3 the foam cures.

After the foam has cured, in step S4 the channel-forming elements such as the Teflon element which does not adhere to the foam are removed. Depending on the number of elements or the manner in which they are inserted, up to 10 channels completely penetrating the foam layer will thus have been created in the foam.

If a fault now arises with the result that the coil ceases to work or no longer works reliably, in step 5 a separating tool such as a saw or a heated wire can be inserted in one or more access channels in order to rip open the foam layer. When the bond provided by the foam layer between inner wall of the cylindrical magnet and the exterior of the coil has been released, the coil is removed in step S6. When the coil has been removed, the replacement coil is in turn installed in accordance with the mounting method described. For this purpose the inner wall of the magnet must first be cleaned of foam residues.

By foaming an access in place for releasing the coil from the foam using suitable separating tools it is possible, with the method according to the invention for mounting a gradient coil in a magnetic resonance system, for the coil to be easily removed again. In order to facilitate removal and provide optimum support in respect of the field of application, it is advisable to use pressure-resistant, fine-pored foams which require no moisture for curing. Foaming-in likewise prevents unwanted vibrations such as the development of noise due to airborne sound from the gap between the gradient coil and the cylindrical magnet.

The invention claimed is:

1. A method for mounting a gradient coil in a cylindrical magnet of a magnetic resonance system and associated magnetic resonance system, comprising:
   foam bonding an exterior of the gradient coil flat against an inner wall of the magnet at least in sections,
   wherein that during bonding at least one element is foamed in place which creates at least one continuous channel, the at least one channel being used for the insertion of a cutting and/or separating tool for ripping open the foamed-in bond between the gradient coil and the cylindrical magnet,
   wherein 1 to 10 channels are created in the foam, and further
   wherein 4 channels are created in the foam.

2. The method as claimed in claim 1, wherein a hose or tube is foamed in place as a channel-creating element.

3. The method as claimed in claim 1, wherein the at least one element which is foamed in place has a conical profile.

4. The method as claimed in claim 1, wherein a Teflon element or a metal element, in particular the_metal element treated with a separating agent, are used as the at least one element.

5. The method as claimed in claim 1, wherein a bond is established over a gap of 1 to 10 mm between the exterior of the gradient coil and the inner wall of the magnet by foaming.

6. The method as claimed in claim 5, wherein the bond is established over a gap of 5 mm.

7. The method as claimed in one of the preceding claim 1, wherein the foaming-in is performed by implementing two foam layers around the circumference of the gradient coil.

8. The method as claimed in claim 7, wherein the foam layers are implemented in the region of the opposite ends relative to a longitudinal axis of the gradient coil.

9. The method as claimed in claim 7, wherein the foam layers are implemented 100 to 200 mm deep in the direction of a longitudinal axis of the gradient coil.

10. The method as claimed in claim 1, wherein the gradient coil is securely supported by inserting wedges underneath.

11. The method as claimed in claim 10, wherein the wedges are designed for positive embedding in the foam.

12. The method as claimed in claim 11, wherein the wedges are designed for positive embedding in the foam by grooves.

13. The method as claimed in claim 1, wherein a pressure-resistant and fine-pored foam is used.

14. The method as claimed in claim 13, wherein the pressure-resistant and fine-pored foam requiring no moisture for curing is used.

15. The method as claimed in claim 1, wherein the at least one channel is designed for the insertion of a heated wire or saw or a sawing wire as the cutting or separating tool.

* * * * *